United States Patent
Wang et al.

(10) Patent No.: US 11,495,454 B2
(45) Date of Patent: Nov. 8, 2022

(54) DEPOSITION OF LOW-STRESS BORON-CONTAINING LAYERS

(71) Applicant: Applied Materials, Inc., Santa Clara, CA (US)

(72) Inventors: Huiyuan Wang, Santa Clara, CA (US); Rick Kustra, San Jose, CA (US); Bo Qi, San Jose, CA (US); Abhijit Basu Mallick, Fremont, CA (US); Kaushik Alayavalli, Sunnyvale, CA (US); Jay D. Pinson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/987,704

(22) Filed: Aug. 7, 2020

(65) Prior Publication Data
US 2022/0044927 A1   Feb. 10, 2022

(51) Int. Cl.
*H01L 21/02*     (2006.01)
*C23C 16/32*     (2006.01)
(Continued)

(52) U.S. Cl.
CPC ........ *H01L 21/02205* (2013.01); *C23C 16/32* (2013.01); *C23C 16/342* (2013.01);
(Continued)

(58) Field of Classification Search
None
See application file for complete search history.

(56) References Cited

U.S. PATENT DOCUMENTS

2005/0008790 A1* 1/2005 Kapoor ............ H01L 21/02164
427/569
2017/0076955 A1* 3/2017 Hudson ............ H01L 21/67167
(Continued)

FOREIGN PATENT DOCUMENTS

| CN | 1210900 A | 3/1999 |
|---|---|---|
| JP | 2004-231988 A | 8/2004 |

(Continued)

OTHER PUBLICATIONS

International Search Report and Written Opinion dated Nov. 18, 2021 in International Patent Application No. PCT/US2021/043376, 7 pages.

*Primary Examiner* — Asok K Sarkar
(74) *Attorney, Agent, or Firm* — Kilpatrick Townsend & Stockton LLP

(57) ABSTRACT

Examples of the present technology include semiconductor processing methods to form boron-containing materials on substrates. Exemplary processing methods may include delivering a deposition precursor that includes a boron-containing precursor to a processing region of a semiconductor processing chamber. A plasma may be formed from the deposition precursor within the processing region of the semiconductor processing chamber. The methods may further include depositing a boron-containing material on a substrate disposed within the processing region of the semiconductor processing chamber, where the substrate is characterized by a temperature of less than or about 50° C. The as-deposited boron-containing material may be characterized by a surface roughness of less than or about 2 nm, and a stress level of less-than or about −500 MPa. In some embodiments, a layer of the boron-containing material may function as a hardmask.

20 Claims, 5 Drawing Sheets

(51) Int. Cl.
   *C23C 16/50*     (2006.01)
   *C23C 16/34*     (2006.01)
   *C23C 16/36*     (2006.01)
   *C23C 16/40*     (2006.01)

(52) U.S. Cl.
   CPC ............ *C23C 16/345* (2013.01); *C23C 16/36* (2013.01); *C23C 16/401* (2013.01); *C23C 16/50* (2013.01); *H01L 21/0262* (2013.01); *H01L 21/02274* (2013.01); *H01L 21/0217* (2013.01); *H01L 21/02112* (2013.01); *H01L 21/02129* (2013.01); *H01L 21/02208* (2013.01); *H01L 21/02532* (2013.01); *H01L 21/02579* (2013.01)

(56)         References Cited

U.S. PATENT DOCUMENTS

2017/0178920 A1*  6/2017  Dole ................. H01L 21/31116
2019/0244838 A1    8/2019  Watanabe et al.
2019/0301019 A1* 10/2019  Watanabe ......... H01J 37/32541
2020/0194272 A1*  6/2020  Jain .................... H01L 21/3065

FOREIGN PATENT DOCUMENTS

JP       2019-102508  A    6/2019
TW         201831723  A    9/2018
TW         202018114  A    5/2020
WO       2005-121047  A1  12/2005
WO       2009-104567  A1   8/2009

* cited by examiner

DEPOSITION OF LOW-STRESS BORON-CONTAINING LAYERS

TECHNICAL FIELD

The present technology relates to methods and systems for semiconductor processing. More specifically, the present technology relates to systems and methods for producing low-stress, boron-containing layers or semiconductor substrates.

BACKGROUND

Integrated circuits are made possible by processes which produce intricately patterned material layers on substrate surfaces. Producing patterned material on a substrate requires controlled methods for forming and removing material. As device sizes continue to reduce, film characteristics may lead to larger impacts on device performance. Materials used to form layers of materials may affect operational characteristics of the devices produced. As material thicknesses continue to reduce, as-deposited characteristics of the films may have a greater impact on device performance.

Thus, there is a need for improved systems and methods that can be used to produce high quality devices and structures. These and other needs are addressed by the present technology.

SUMMARY

Embodiments of the present technology include semiconductor processing methods to form boron-containing materials on substrates. Exemplary processing methods may include delivering a deposition precursor that includes a boron-containing precursor to a processing region of a semiconductor processing chamber. A plasma may be formed from the deposition precursor within the processing region of the semiconductor processing chamber. The methods may further include depositing a boron-containing material on a substrate disposed within the processing region of the semiconductor processing chamber, where the substrate is characterized by a temperature of less than or about 50° C.

In exemplary embodiments, the boron-containing precursor may include one or more compounds chosen from boron carbide, boron-nitride, boron-carbide-nitride, boron-containing silicon, boron-containing silicon oxide, boron-and-boron-containing silicon oxide, and boron-containing silicon nitride. In addition to the boron-containing precursor, the deposition precursor may include one or more of a boron-containing precursor, a silicon-containing precursor, and a nitrogen-containing precursor. In additional embodiments, an inert precursor may be delivered to the processing region in addition to the deposition precursor, and a flow rate ratio of the inert precursor to the deposition precursor may be greater than or about 10:1. Exemplary inert precursors may include helium or argon. In further embodiments, the semiconductor processing chamber may be characterized by a pressure of less than or about 100 mTorr in the substrate processing region, and the plasma that is formed may be a bias plasma formed at a bias power of greater than 2000 Watts.

Additional embodiments of the semiconductor processing methods may include delivering a deposition precursor that includes a boron-containing precursor to a processing region of a semiconductor processing chamber. A bias power may be applied to a substrate disposed within the processing region of the semiconductor processing chamber, where the bias power is greater than or about 3000 Watts. A plasma may be formed of the deposition precursor within the processing region of the semiconductor processing chamber, and a boron-containing material may be deposited on the substrate.

In exemplary embodiments, the bias power may be greater than or about 4000 Watts. In additional exemplary embodiments, an inert precursor may be delivered to the processing region in addition to the deposition precursor, and a flow rate ratio of the inert precursor to the deposition precursor may be greater than or about 10:1. The substrate may be characterized by a temperature of less than or about 50° C. during at least a portion of the deposition of the boron-containing material.

Still additional embodiments of the semiconductor processing methods may include delivering a boron-containing precursor to a processing region of a semiconductor processing chamber. Exemplary methods may further include forming a plasma of the boron-containing precursor within the processing region of the semiconductor processing chamber, and depositing a boron-containing material on a substrate disposed within the processing region. The boron-containing material may be characterized by an as-deposited surface roughness of less than or about 2 nm.

In exemplary embodiments, the as-deposited boron-containing material may be characterized by a stress level less than or about −500 MPa. The as-deposited boron-containing material may also include carbon, where greater than or about 60% of the carbon atoms have $sp^3$ hybridized bonds. In additional exemplary embodiments, the boron-containing material may have less than or about 25 mol % hydrogen. Exemplary boron-containing materials may include one or more compounds chosen from boron carbide, boron-nitride, boron-carbide-nitride, boron-containing silicon, boron-containing silicon oxide, boron-and-boron-containing silicon oxide, and boron-containing silicon nitride. In further exemplary embodiments, an inert precursor may be delivered to the substrate processing region in addition to the boron-containing precursor, and a flow rate ratio of the inert precursor to the boron-containing precursor may be greater than or about 10:1. A bias power may be applied to the substrate during the deposition of the boron-containing material, where the bias power is greater than or about 3000 Watts. The substrate may be characterized by a temperature of less than or about 50° C. during the deposition of the boron-containing material.

Such technology may provide numerous benefits over conventional systems and techniques. For example, embodiments of the present technology produce as-deposited boron-containing layers with low surface roughness that make them well suited for hardmasks, among other functions. In addition, the as-deposited boron-containing layers have low stress that do not significantly bend or distort adjacent substrate features. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
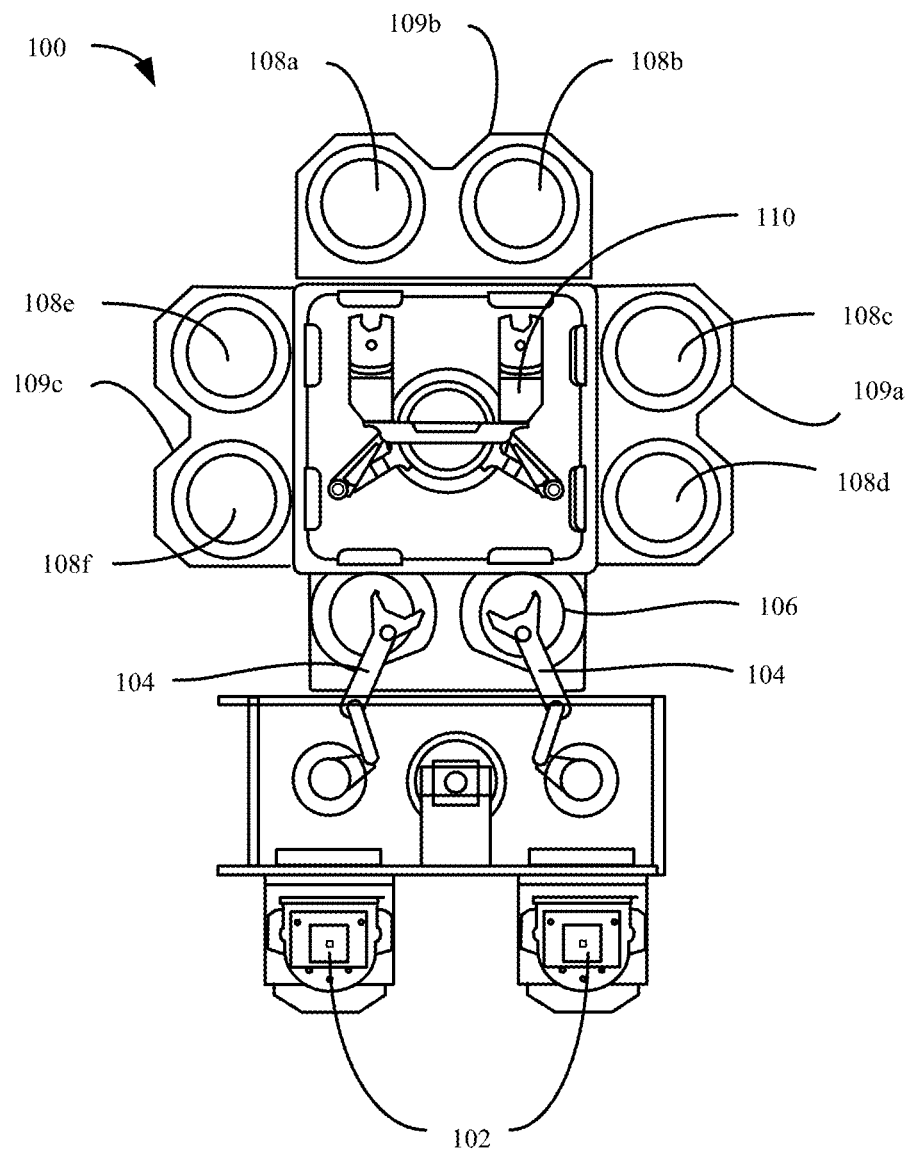
FIG. 1 shows a top view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and process methods for depositing a boron-containing layer characterized by low roughness and low stress on a semiconductor substrate. Embodiments of these systems and methods address the problem of forming an as-deposited boron-containing layer characterized by low roughness and low stress that undergoes fewer post-deposition treatment operations to smooth out surface roughness and neutralize stress. Boron-containing layers characterized by low roughness and low stress are receiving increasing interest as, for example, hardmasks to pattern an etch of high aspect ratio (HAR) features in underlying materials of a substrate.

Examples of these HAR features include the channels and contacts in 3D NAND memory cells that can extend through hundreds of silicon-containing layers and may be characterized by aspect ratios (i.e., the ratio of height-to-width) greater than or about 70:1. Conventionally formed boron-containing hardmasks are characterized by high selectivity for etching the silicon-containing layers over the hardmask, but also characterized by high surface roughness (e.g., average surface roughness greater than or about 10 nm), and high stress (e.g., stress levels of less than or about −1000 MPa, where a more negative the stress value represents a greater exertion of compressive force by the material), which create problems during the etch. These problems include distorted patterning and poor critical dimension uniformity caused by the high surface roughness. They also include bending and bowing of the underlying substrate stack, and fracturing of the mask, all caused by high stress in the hardmask layer.

Conventional systems and methods address these problems by performing post-deposition hardmask treatment operations, such as chemical mechanical polishing (CMP) operations to smooth the rough surface, and thermal or plasma annealing operations to neutralize the high stress. Additional conventional systems and methods include the deposition of multiple hardmask layers with offsetting tensile and compressive stresses that combine to form a more neutral-stress hardmask laminate. These operations add complexity, time, and costs to the conventional formation of a boron-containing hardmask.

Eliminating the surface roughness and alleviating the stress by replacing or eliminating the boron-containing layers that act as hardmasks during the patterning and etching of device features in and on a substrate is problematic. Boron-containing hardmasks are typically deposited between underlying substrate materials and overlying energy-sensitive resist layer (e.g., a photoresist layer). The hardmask provides selective resistance to the etchants used to form features in the underlying substrate materials according to the pattern created in the energy-sensitive resist layer. The boron in the hardmask further enhances etch selectivity to keep an underlying substrate feature intact during an etch operation. If the hardmask layer were eliminated, or if the boron were removed from the hardmask, the etchants would be more likely to attack portions of the underlying substrate feature intended to stay intact, resulting in the erosion and possible destruction of the features.

The present technology addresses these problems, among others, by providing systems and process methods to deposit a boron-containing material characterized by at least one of low-roughness and low-stress. In some embodiments, the as-deposited boron-containing material may act as a boron-containing hardmask, among other functions. Embodiments of the systems and methods deposit the boron-containing materials by maintaining one or more process parameters that operate in conjunction to slow the growth rate of boron-containing crystals in the deposited material, reduce hydrogen incorporation in the deposited materials, improve carbon bonding in the deposited materials, and lower the amount of stress in the deposited material. Some of these parameters, described below, include the substrate temperature, the flow rate ratio of inert precursors to boron-containing precursors that help form a deposition plasma, and the bias power used to generate the deposition plasma, among other process parameters.

Embodiments of the present technology include systems and methods to inhibit crystal growth of boron-containing compounds in deposited boron-containing materials. The smaller average size of the crystals in the as-deposited materials may result in decreased surface roughness. In some embodiments, the systems and methods also include the deposition of boron-containing material characterized by lower amounts of hydrogen. The lower hydrogen content may contribute to a reduction in the average size of boron-containing crystals, and form an as-deposited boron-containing film characterized by decreased surface roughness. In additional embodiments, the systems and methods include the deposition a boron-and-carbon-containing film, where an increased number of carbon atoms are characterized by $sp^3$ hybridization. The increased number of carbon atoms characterized by $sp^3$ hybridization may reduce the average size of boron-containing crystals, and form an as-deposited boron-and-carbon-containing film characterized by decreased surface roughness. Thus, the present technology includes embodiments for the formation of as-deposited boron-containing layers characterized by at least one of low surface roughness and low stress. In some embodiments, these systems and methods form a low-roughness, low-stress boron-containing layer, for example a hardmask layer, without complex, time-consuming, and costly, post-deposition treatment operations to reduce the surface roughness of neutralize stress in the layer.

Although the remaining disclosure will routinely identify specific deposition processes utilizing the disclosed technology, it will be readily understood that the systems and methods are equally applicable to other deposition and treatment processes as may occur in the described chambers or any other chamber. Accordingly, the present technology may be implemented in a variety of chemical-vapor-deposition chambers, and should not be considered to be so limited as for use with these specific deposition processes or chambers alone. The disclosure will discuss one possible system and chamber that may be used in performing process methods according to some embodiments of the present technology before additional variations and adjustments to this system according to embodiments of the present technology are described.

FIG. 1 shows a top plan view of one embodiment of a semiconductor processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2A:
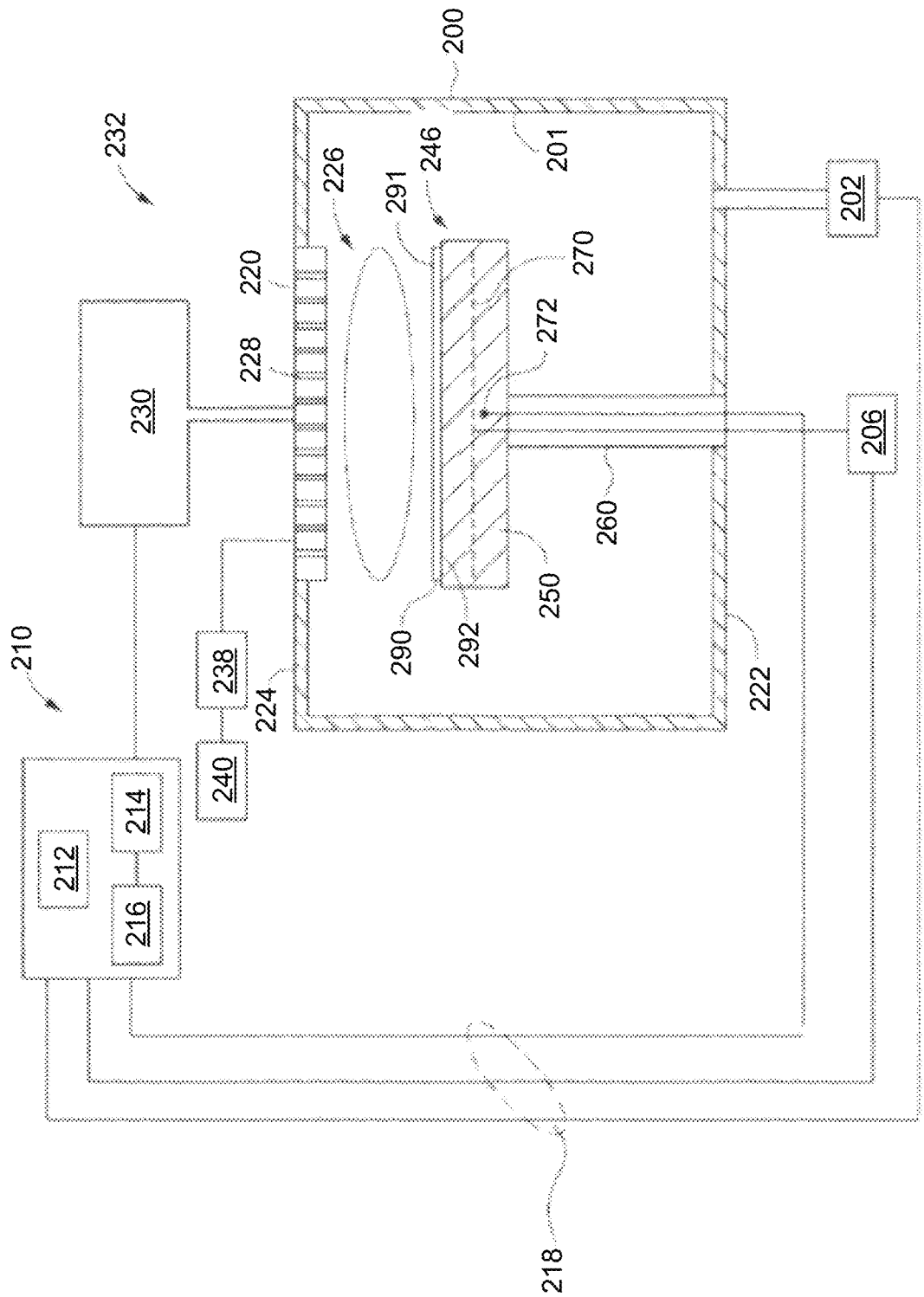
FIG. 2A shows a schematic cross-sectional view of an exemplary semiconductor processing chamber according to some embodiments of the present technology.
Figure 2B:
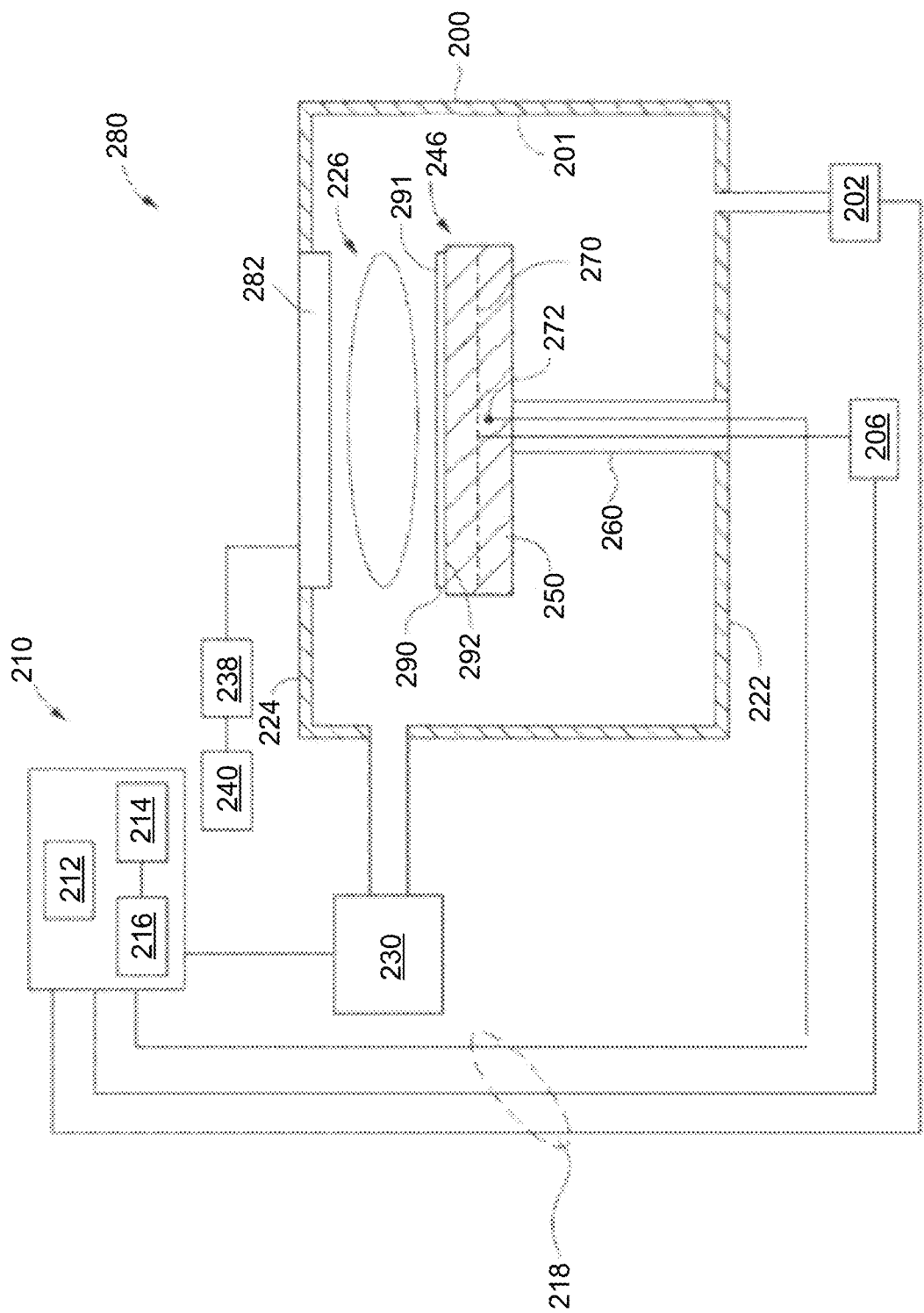
FIG. 2B shows a schematic cross-sectional view of an additional exemplary semiconductor processing chamber according to some embodiments of the present technology.

FIGS. 2A and 2B show a schematic cross-sectional views of an exemplary semiconductor processing systems 232 and 280 according to some embodiments of the present technology. The figures may illustrate an overview of systems incorporating one or more aspects of the present technology, and/or which may be specifically configured to perform one or more operations according to embodiments of the present technology. Additional details of the systems 232 and 280, and methods performed, may be described further below. Systems 232 and 280 may be utilized to form boron-containing layers, such as boron-containing hardmasks, according to some embodiments of the present technology, although it is to be understood that the methods may similarly be performed in any system within which layer formation may occur.

Referring now to FIG. 2A, the semiconductor processing system 232 includes semiconductor processing chamber 200, which may include a top wall 224, a sidewall 201 and a bottom wall 222 that define a substrate processing region 226. A gas panel 230 and a controller 210 may be coupled to the processing chamber 200. A substrate support assembly 246 may be provided in the substrate processing region 226 of the process chamber 200.

The substrate support assembly 246 may include an electrostatic chuck 250 supported by a stem 260. The electrostatic chuck 250 may be fabricated from aluminum, ceramic, and other suitable materials such as stainless steel. The electrostatic chuck 250 may be moved in a vertical direction inside the process chamber 200 using a displacement mechanism (not shown). A temperature sensor 272, such as a thermocouple, may be embedded in the electrostatic chuck 250 to monitor the temperature of the electrostatic chuck 250. The measured temperature may be used by the controller 210 to control the power supplied to the heater element 270 to maintain the substrate at a desired temperature.

A vacuum pump 202 may be coupled to a port formed in the bottom of the process chamber 200. The vacuum pump 202 may be used to maintain a desired gas pressure in the process chamber 200. The vacuum pump 202 also evacuates post-processing gases and by-products of the process from the process chamber 200.

A gas distribution assembly 220 having a plurality of apertures 228 may be disposed on the top of the process chamber 200 above the electrostatic chuck 250. The apertures 228 of the gas distribution assembly 220 are utilized to introduce process gases into the process chamber 200. The apertures 228 may have different sizes, number, distributions, shape, design, and diameters to facilitate the flow of the various process gases for different process requirements. The gas distribution assembly 220 is connected to the gas panel 230 that allows various gases to flow to the processing volume 226 during processing. A plasma is formed from the process gas mixture exiting the gas distribution assembly 220 to enhance thermal decomposition of the process gases resulting in the deposition of material on a top surface 291 of a substrate 290 positioned on the electrostatic chuck 250.

The gas distribution assembly 220 and the electrostatic chuck 250 may form a pair of spaced apart electrodes in the processing volume 226. One or more RF power sources 240 provides a bias potential through a matching network 238, which is optional, to the gas distribution assembly 220 to facilitate generation of plasma between the gas distribution assembly 220 and the electrostatic chuck 250. Alternatively, the RF power source 240 and the matching network 238 may be coupled to the gas distribution assembly 220, the electrostatic chuck 250, or coupled to both the gas distribution assembly 220 and the electrostatic chuck 250, or coupled to an antenna (not shown) disposed exterior to the process chamber 200. In some embodiments, the RF power source 240 may produce power at a frequency of greater than or about 100 KHz, greater than or about 500 KHz, greater than or about 1 MHz, greater than or about 10 MHz, greater than or about 20 MHz, greater than or about 50 MHz, greater than or about 100 MHz, among other frequency ranges. Specific examples of frequencies of the power produced by RF power source 240 include 350 KHz, 2 MHz, 13.56 MHz, 27 MHz, 40 MHz, 60 MHz, 100 MHz, and 162 MHz, among other frequencies.

The controller 210 includes a central processing unit (CPU) 212, a memory 216, and a support circuit 214 utilized to control the process sequence and regulate the gas flows from the gas panel 230. The CPU 212 may be of any form of a general-purpose computer processor that may be used in an industrial setting. The software routines can be stored in the memory 216, such as random access memory, read only memory, floppy, or hard disk drive, or other form of digital storage. The support circuit 214 is coupled to the CPU 212 and may include cache, clock circuits, input/output systems, power supplies, and the like. Bi-directional communications between the controller 210 and the various components of the substrate processing system 232 are handled through numerous signal cables collectively referred to as signal buses 218, some of which are illustrated in FIG. 2A.

FIG. 2B depicts a schematic cross-sectional view of another substrate processing system 280 that can be used for the practice of embodiments described herein. The substrate processing system 280 is similar to the substrate processing system 232 of FIG. 2A, except that the substrate processing system 280 is configured to radially flow processing gases from gas panel 230 across the top surface 291 of the substrate 290 via the sidewall 201. In addition, the gas distribution assembly 220 depicted in FIG. 2A is replaced with an electrode 282. The electrode 282 may be configured for secondary electron generation. In one embodiment, the electrode 282 is a silicon-containing electrode.

Figure 3:
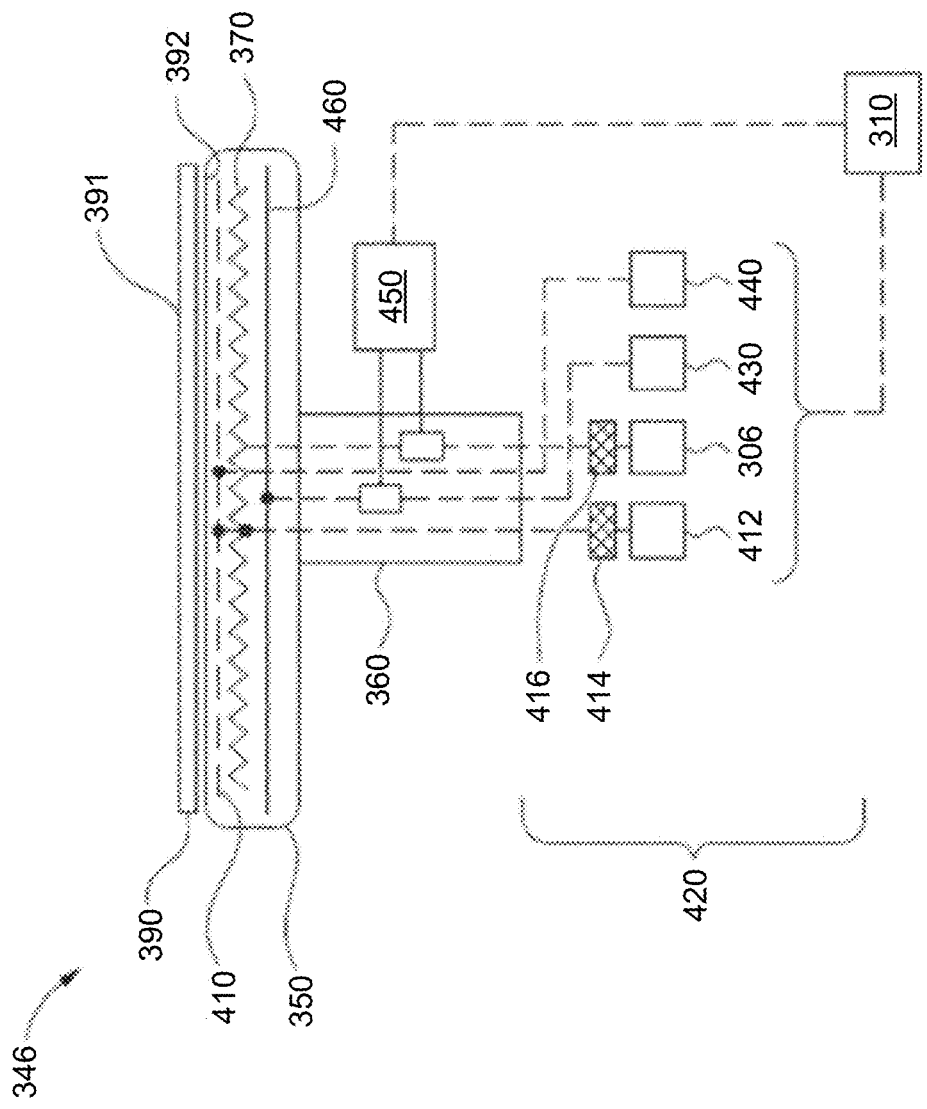
FIG. 3 shows a schematic cross-sectional view of an exemplary substrate support and electrostatic chuck according to some embodiments of the present technology.

FIG. 3 depicts a schematic cross-sectional view of the substrate support assembly 346 that may be used in embodiments of the systems. The substrate support assembly 346 may include an electrostatic chuck 350, which may include a heater element 370 suitable for controlling the temperature of the substrate 390 supported on an upper surface 392 of the electrostatic chuck 350. The heater element 370 may be embedded in the electrostatic chuck 350. The electrostatic chuck 350 may be resistively heated by applying an electric current from a heater power source 306 to the heater element 370. The heater power source 306 may be coupled through an RF filter 316 to protect the heater power source 306 from RF energy. The electric current supplied from the heater power source 306 is regulated by the controller 310 to control the heat generated by the heater element 370, thus maintaining the substrate 390 and the electrostatic chuck 350 at a substantially constant temperature during film deposition. The supplied electric current may be adjusted to selectively control the temperature of the electrostatic; chuck 350 between about 20° C. to about 350° C. during deposition of a carbon-containing film on the substrate. A cooling unit (not shown) may also be thermally coupled to the substrate support assembly 346 to selectively control the temperature of the substrate 390 to a temperature between about −50° C. to about 20° C.

In some embodiments, the electrostatic chuck 350 includes a chucking electrode 410, which may be a mesh of a conductive material. The chucking electrode 410 may be embedded in the electrostatic chuck 350. The chucking electrode 410 is coupled to a chucking power source 412 that, when energized, electrostatically clamps the substrate 390 to the upper surface 392 of the electrostatic chuck 350.

The chucking electrode 310 may be configured as a monopolar or bipolar electrode, or have another suitable arrangement. The chucking electrode 410 may be coupled through an RF filter 414 to the chucking power source 412, which provides direct current (DC) power to electrostatically secure the substrate 390 to the upper surface 392 of the electrostatic chuck 350. The RF filter 414 prevents RF power utilized to form plasma within the process chamber from damaging electrical equipment. The electrostatic chuck 350 may be fabricated from a ceramic material, such as AlN or $Al_2O_3$.

A power application system 420 is coupled to the substrate support assembly 346. The power application system 420 may include the heater power source 306, the chucking power source 412, a first radio frequency (RF) power source 430, and a second RF power source 440. Embodiments of the power application system 420 may additionally include the controller 310, and a sensor device 450 that is in communication with the controller 310 and both of the first RF power source 430 and the second RF power source 440. The controller 310 may also be utilized to control the plasma from the processing gas by application of RF power from the first RF power source 430 and the second RF power source 440 in order to deposit a layer of material on the substrate 390.

As described above, the electrostatic chuck 350 includes the chucking electrode 410 that may function in one aspect to chuck the substrate 390 while also functioning as a first RF electrode. The electrostatic chuck 350 may also include a second RF electrode 460, and together with the chucking electrode 410, may apply RF power to tune the plasma. The first RF power source 430 may be coupled to the second RF electrode 460 while the second RF power source 440 may be coupled to the chucking electrode 410. A first matching network and a second matching network may be provided for the first RF power source 430 and the second RF power source 440, respectively. The second RF electrode 460 may be a solid metal plate of a conductive material or a mesh of conductive material.

The first RF power source 430 and the second RF power source 440 may produce power at the same frequency or a different frequency. In some embodiments, one or both of the first RF power source 430 and the second RF power source 440 may independently produce power at a frequency of greater than or about 100 KHz, greater than or about 500 KHz, greater than or about 1 MHz, greater than or about 10 MHz, greater than or about 20 MHz, greater than or about 50 MHz, greater than or about 100 MHz, among other frequency ranges. Specific examples of frequencies of the power independently produced by RF power sources 430, 440 include 350 KHz, 2 MHz, 13.56 MHz, 27 MHz, 40 MHz, 60 MHz, 100 MHz, and 162 MHz, among other frequencies. RF power from one or both of the first RF power source 430 and second RF power source 440 may be varied in order to tune the plasma.

Figure 4:
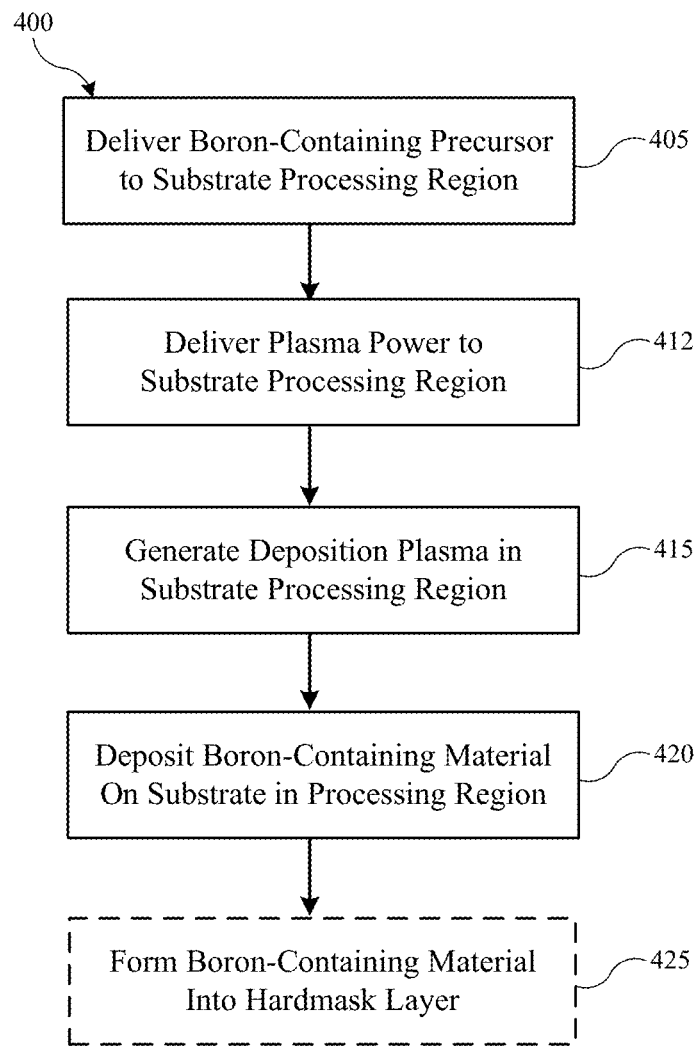
FIG. 4 shows operations in a semiconductor processing method according to some embodiments of the present technology.

FIG. 4 shows exemplary operations in a processing method 400 according to some embodiments of the present technology. The method may be performed in a variety of processing chambers, including processing systems 232 and 280 described above. Method 300 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

Method 400 may involve optional operations to develop the semiconductor structure to a particular fabrication operation. Although in some embodiments method 400 may be performed on a base structure, in some embodiments the method may be performed subsequent other material formation or removal. For example, any number of deposition, masking, or removal operations may be performed to produce any transistor, memory, or other structural aspects on a substrate. In some embodiments one or more structures formed on a substrate may be characterized by a thermal budget of less than or about 500° C., less than or about 450° C., less than or about 400° C., or less. Accordingly, method 400 and any subsequent operations may be performed at temperatures that are at or below the structural thermal budget. The substrate may be disposed on a substrate support, which may be positioned within a processing region of a semiconductor processing chamber. The operations to produce the underlying structures may be performed in the same chamber in which aspects of method 400 may be performed, and one or more operations may also be performed in one or more chambers on a similar platform as a chamber in which operations of method 400 may be performed, or on other platforms.

In some embodiments, method 400 may include delivering one or more boron-containing precursors to the substrate processing region of a substrate processing chamber 405. Exemplary boron-containing precursors may include boron-and-hydrogen-containing compounds (e.g., boranes) such as borane ($BH_3$), diborane ($B_2H_6$), or other multicenter-bonded boron-and hydrogen-containing compounds. Additional exemplary boron-containing precursors may include boron-and-carbon-containing compounds, such as boron-containing hydrocarbons (e.g., $B_x-(C_yH_z)$ compounds) as well as other organoboron compounds. as well as any other boron-containing materials that may be used to produce boron-containing materials.

The one or more boron-containing precursors may be combined with at least one inert precursor. In some embodiments, inert precursors may act as a carrier gas that is mixed with the boron-containing precursors prior to their delivery to the substrate processing region, and help carry the boron-containing precursors into the substrate processing region. In additional embodiments, the inert precursors may be delivered by an independent channel from the boron-containing precursors, and the two types of precursors may be combined in the substrate processing region of the substrate processing chamber. In still further embodiments, the inert precursors may be both carrier gases for the boron-containing precursors and inert precursors independently delivered to the substrate processing region. Exemplary inert precursors include helium and argon, among other inert precursors.

It has been found that the relative flow rates of the inert precursors to the boron-containing precursors can affect characteristics of the as-deposited boron-containing material, including the surface roughness and the amount of stress in the material. In some embodiments, a flow rate ratio of the inert precursors to the boron-containing precursors may be greater than or about 10:1, and may be greater than or about 20:1, greater than or about 30:1, greater than or about 40:1, greater than or about 50:1, or more. Exemplary flow rate ranges for the inert precursors may include more than or about 1000 sccm. Additional exemplary flow rate ranges for the inert precursors may include more than or about 1500 sccm, more than or about 2000 sccm, more than or about 2500 sccm, more than or about 3000 sccm, more than or about 3500 sccm, more than or about 4000 sccm, more than or about 4500 sccm, more than or about 5000 sccm, or more. Exemplary flow rates ranges for the boron-containing precursors may include less than or about 50 sccm. Additional exemplary flow rate ranges may include less than or about 100 sccm, less than or about 75 sccm, less than or about 40 sccm, less than or about 30 sccm, less than or about 20 sccm, less than or about 10 sccm, less than or about 5 sccm, or less.

The dilution of the boron-containing precursors in an excess of the inert precursors in the substrate processing region has been found to form an as-deposited layer of boron-containing material on the substrate with a reduced level of stress when combined with higher plasma power. For example, when highly diluted precursors are provided with high plasma power, an increased plasma density may be produced that includes a greater amount of radical effluents that may facilitate modifying the deposited film structure without being incorporated within the film formed. By forming a bias plasma, such as generating plasma from bias power as opposed to applying a bias to a capacitively coupled plasma, and by utilizing higher bias power, increased ion impact may be afforded during deposition. When the precursors forming the plasma include higher dilution with inert precursors in these high-power scenarios, the increased bombardment during formation may improve the deposited film structure by slowing the growth rate of boron-containing crystals, and increasing hydrogen removal, among other effects.

In some embodiments, additional precursors may be delivered with the boron-containing precursors and inert precursors to the substrate processing region. These additional precursors may include one or more hydrocarbon-containing precursors. In these embodiments, the boron-containing material deposited on the substrate may be characterized as a boron-and-carbon-containing material. Exemplary hydrocarbon-containing precursors may include acetylene ($C_2H_2$). Additional exemplary hydrocarbon-containing precursors may include hydrocarbon compounds having the general formula $C_xH_y$, where x has a range of between 1 and 20 and y has a range of between 1 and 20. Suitable hydrocarbon compounds include, for example, $C_3H_6$, $CH_4$, $C_4H_8$, 1,3-dimethyladamantane, bicyclo[2.2.1] hepta-2,5-diene (2,5-Norbornadiene), adamantine ($C_{10}H_{16}$), norbornene ($C_7H_{10}$), among other hydrocarbon compounds. In some embodiments a carbon to hydrogen ratio may be maintained to be less than or about 4:1, less than or about 3:1, less than or about 2:1, less than or about 1:1, or less, which may further facilitate limiting hydrogen incorporation during film formation. Exemplary flow rate ranges for the hydrocarbon-containing precursor may include less than or about 50 sccm. Additional exemplary flow rate ranges may include less than or about 100 sccm, less than or about 75 sccm, less than or about 40 sccm, less than or about 30 sccm, less than or about 20 sccm, less than or about 10 sccm, less than or about 5 sccm, or less.

In further embodiments, additional precursors may include nitrogen-containing precursors. In these embodiments, the boron-containing material deposited on the substrate may be characterized as a boron-and-nitrogen-containing material, such as boron nitride. If a carbon-containing precursor is also present, the boron-containing material deposited on the substrate may be characterized as a boron-carbon-and-nitrogen-containing material. Exemplary nitrogen-containing precursors may include ammonia ($NH_3$), molecular nitrogen ($N_2$), and nitrous oxide ($N_2O$), among other nitrogen-containing precursors. Exemplary flow rate ranges for the nitrogen-containing precursors may include less than or about 20 sccm. Additional exemplary flow rate ranges may include less than or about 100 sccm, less than or about 75 sccm, less than or about 50 sccm, less than or about 40 sccm, less than or about 30 sccm, less than or about 10 sccm, less than or about 5 sccm, or less.

In some embodiments, a hydrogen-containing precursor or plasma may also be introduced to the substrate processing region. Exemplary hydrogen containing precursors such as hydrogen gas ($H_2$) may be formed into hydrogen radicals that are delivered to the substrate to mix and react with other plasma effluents and/or the depositing material. In some embodiments where hydrocarbon-containing precursors are also present, the hydrogen radicals may react with carbons having $sp^2$ hybridization and convert them into $sp^3$ hybridized carbons. In some embodiments, the hydrogen radicals may be generated in a remote-plasma-system (RPS) positioned outside the processing chamber and delivered to the substrate processing region.

In embodiments of the present technology, the precursors are delivered to a substrate processing chamber that has a substrate present in the substrate processing region of the chamber. In some embodiments, the substrate may be positioned on a substrate support assembly in the substrate processing region, and may be maintained at a temperature less than or about 50° C. In additional embodiments, the substrate temperature may be maintained down to about 20° C. by heater elements in a substrate support assembly in the substrate processing chamber. In further embodiments, the substrate temperature may be maintained at less than or about 20° C. by a cooling unit that delivers a cooling fluid to the substrate support assembly. Additional substrate temperature ranges include less than or about 40° C., less than or about 30° C., less than or about 20° C., less than or about 10° C., less than or about 0° C., less than or about −10° C., less than or about −20° C., less than or about −30° C., or less.

Maintaining the temperature of the substrate at less than or about 50° C. during the deposition of the boron-containing material has been found to form a low-roughness, low-stress layer when combined with at least one of the dilution of the boron-containing precursors and the use of higher plasma power to generate the boron-containing deposition plasma. As noted above, when highly diluted precursors are provided with high plasma power, an increased plasma density may be produced that includes a greater amount of radical effluents that may facilitate modifying the deposited film structure without being incorporated within the film formed. The modified film structure may be characterized by smaller boron-containing crystals that reduce surface roughness, and lower hydrogen content that reduces film stress. Film formation at substrate temperatures of less than or about 50° C. may slow the growth rate of boron-containing crystals, and slow regrowth of boron-containing crystals that have been fractured or prevented from growing larger by the increased bombardment of inert precursors. In addition, film formation at these low substrate temperatures may contribute to the formation of materials with less hydrogen content that complements the deposition conditions created by the increased bombardment of the inert precursors.

Exemplary substrates provided in the substrate processing region may include a base substrate of crystalline silicon (e.g., Si<100> or Si<111>) silicon oxide, strained silicon, silicon germanium, doped or undoped polysilicon, doped or undoped silicon substrates and patterned or non-patterned substrates silicon on insulator (SOI), carbon-doped silicon oxides, silicon nitride, doped silicon, germanium, gallium arsenide, glass, and sapphire, among other base substrate materials. Exemplary substrates may further include one or more layers of material formed on the base substrate. These one or more layers may include layers of conductive material (e.g., metal-containing layers), semiconductor material (e.g., amorphous silicon layers), and insulator material (e.g., silicon nitride, silicon oxide). In some embodiments, the substrate may include a base substrate and multiple layers (e.g., greater than or about 48 layers, greater than or about 65 layers, greater than or about 96 layers, greater than or about 128 layers, greater than or about 256 layers, or more) of materials that constitute a film stack for applications such as 3D NAND memory structures. The substrate may further include substrate features such as gaps, vias, trenches, steps, among other types of features. The substrate features may be formed directly in a base substrate. Alternatively, or in addition, the substrate features may be formed in layers of insulating, conductive, and/or semiconductive materials deposited on the base substrate that constitute part of the substrate. Exemplary substrates may take various shapes such as circular, rectangular, or square, and may have dimensions of, for example, 200 mm, 300 mm, or 450 mm, in diameter, side, or diagonal.

In some embodiments, the precursors supplied to the substrate processing region may generate and maintain a processing pressure in the substrate processing chamber of less than or about 100 mTorr. Additional exemplary processing pressure ranges include less than or about 1 Torr, less than or about 500 mTorr, less than or about 50 mTorr, less than or about 10 mTorr, less than or about 5 mTorr, less than or about 1 mTorr, less than or about 0.1 mTorr, or less, among other pressure ranges. By lowering the processing pressure in some embodiments, increased ion bombardment may occur by increasing the mean-free path between atoms. This may increase the distance of travel between collisions, which may increase energy and bombardment at the film surface. This may further facilitate reduction of hydrogen and increased formation of improved carbon bonding within the film formed to reduce the stress of the produced film.

Embodiments of method 400 further include delivering plasma power to the substrate processing region 412. In some embodiments, the plasma power may be delivered as a bias power that originates with a RF power source in electrical contact with an electrostatic chuck that is in electrical contact with the substrate. As noted previously, some embodiments of the present technology may produce a bias plasma at a higher plasma power to improve film characteristics of the as-deposited material. For example, in some embodiments the bias plasma may be produced at a delivered power of greater than or about 2000 W, greater than or about 2500 W, greater than or about 3000 W, greater than or about 3500 W, greater than or about 4000 W, greater than or about 4500 W, or greater. By increasing the plasma power, which may be performed in conjunction with increased inert precursor delivery, an amount of bombardment from the inert precursor may be produced, which may modify the deposited materials to improve carbon bonding and reduce hydrogen incorporation. The RF power source may produce power at a frequency of, for example, about 350 KHz to about 162 MHz (e.g., 350 KHz, 2 MHz, 13.56 MHz, 27 MHz, 40 MHz, 60 MHz, 100 MHz, or 162 MHz).

Referring to FIG. 3 above, in some embodiments the RF bias power may be delivered to the precursors in the substrate processing region by the electrostatic chuck 350 that is supplied with RF power from the second RF power source 440. In additional embodiments, the RF bias power may also be supplied in whole or in part by the second RF electrode 460 in electronic communication with the first RF power source 430 that supplies a biasing voltage to the second RF electrode 460. The first RF power source 430 may produce power at a frequency of from about 350 KHz to about 100 MHz (e.g., 350 KHz, 2 MHz, 13.56 MHz, 27 MHz, 40 MHz, 60 MHz, or 100 MHz).

In some embodiments, operation 412 may further comprise applying a second RF bias power to the electrostatic chuck to independently control ion density and ion energy to modulate film stress. The second RF bias power may be greater than or about 10 Watts, and may have a frequency greater than or about 350 KHz. Referring to FIG. 3, in some embodiments, the second RF bias power is provided to the substrate 391 via the chucking electrode 410. The chucking electrode 410 may be in electronic communication with second RF power source 440 that supplies a biasing voltage to the chucking electrode 410. The second RF bias power may be provided at a power greater than or about 10 Watts. In some embodiments, the RF bias power and the second RF bias power may both be delivered to the precursors to generate a plasma during operation 412. In additional embodiments, the RF bias power may be delivered to the substrate via the chucking electrode 410, and the second RF bias power may be delivered via the second RF electrode 460.

In embodiments of method 400, the plasma power delivered to the substrate processing region generates a deposition plasma from the precursors supplied to the substrate processing region at operation 415. The generated deposition plasma may include boron-containing constituents. In some embodiments, one or more of hydrocarbon-containing constituents and nitrogen-containing constituents may also be present in the generated plasma. In some embodiments, the plasma may be in direct contact with the substrate that is also located in the substrate processing region of the substrate processing chamber.

The generated plasma deposits a boron-containing material on the substrate in the substrate processing chamber at operation 420. In some embodiments, the boron-containing material is deposited on the substrate at a rate of less than or about 700 Å/min. Additional exemplary deposition rate ranges include less than or about 600 Å/min, less than or about 500 Å/min, less than or about 400 Å/min, less than or about 300 Å/min, less than or about 200 Å/min, less than or about 100 Å/min, or less. The amount of material deposited may be a layer with an average thickness greater than or about 10 Å. Additional exemplary average thickness ranges may include greater than or about 50 Å, greater than or about 100 Å, greater than or about 1000 Å, greater than or about 5000 Å, greater than or about 10,000 Å, greater than or about 20,000 Å, or more.

The amount of boron incorporation in the as-deposited material may be based on any percentage incorporation. For example, the as-deposited material may include greater than or about 5% boron incorporation, and in some embodiments may include greater than or about 10% boron incorporation, greater than or about 15% boron incorporation, greater than or about 20% boron incorporation, greater than or about 25% boron incorporation, greater than or about 30% boron incorporation, greater than or about 35% boron incorporation, greater than or about 40% boron incorporation, greater than or about 45% boron incorporation, greater than or about 50% boron incorporation, greater than or about 55% boron incorporation, greater than or about 60% boron incorporation, greater than or about 65% boron incorporation, greater than or about 70% boron incorporation, greater than or about 75% boron incorporation, greater than or about 80% boron incorporation, greater than or about 85% boron incorporation, greater than or about 90% boron incorporation, greater than or about 95% boron incorporation, or greater.

In embodiments of the present technology, the as-deposited boron-containing material may be characterized by a reduced amount of hydrogen. Exemplary ranges for the amount of hydrogen in the as-deposited, boron-containing material may include less than or about 25 mol. %. Additional exemplary ranges for the amount of hydrogen in the as-deposited material may include less than or about 20 mol. %, less than or about 15 mol. %, less than or about 10 mol. %, or less. As noted above, the reduced amount of hydrogen in the material may contribute to reduced levels of stress in the material.

In some embodiments, the as-deposited material may include carbon in addition to boron. The carbon in the as-deposited material may be characterized by $sp^3$ hybridized bonding may that is greater than or about 60% of the carbon atoms in the deposited material. Additional exemplary ranges for the percentage of $sp^3$ hybridized carbon atoms may include greater than or about 40%, greater than or about 50%, greater than or about 65%, greater than or about 70%, and greater than or about 80%, greater than or about 90%, or more. The high percentages of $sp^3$ hybridized carbons in the material may reduce the stress levels in the material compared to boron-and-carbon-containing materials that have lower percentages of $sp^3$ hybridized carbons and higher percentages of $sp^2$ hybridized carbons. The increased amount of carbon atoms with $sp^3$ hybridization increases the number of covalently-networked carbon-carbon single bonds, while $sp^2$ hybridization gives an as-deposited layer with more graphite-like-carbon characteristics. Covalently-networked carbon has a more isotropic distribution of carbon-carbon bond lengths and strengths compared to graphite-like-carbon, where in-plane bonds are shorter and stronger than the orthogonal bonds outside the plane. As a result, the boron-and-carbon-containing layers with increased numbers of $sp^3$ hybridized carbons may be deposited with lower stress than more graphite-like layers that contain greater amounts of $sp^2$ hybridized carbons.

In some embodiments, the boron-containing material may be deposited with low roughness. Exemplary ranges for average surface roughness may be less than or about 2 nm, less than or about 1.5 nm, less than or about 1.0 nm, less than or about 0.9 nm, less than or about 0.8 nm, less than or about 0.7 nm, less than or about 0.6 nm, less than or about 0.5 nm, less than or about 0.4 nm, less than or about 0.3 nm, less than or about 0.2 nm, or less. Additionally, the roughness may be substantially controlled regardless of film thickness in some embodiments. This may allow avoidance of additional chemical-mechanical polishing operations, as the as-deposited film may be characterized by any of the average roughness ranges illustrated. Additionally, the as-deposited boron-containing layer may have a low roughness range, such as the difference between a highest peak and a lowest peak on the formed film. Exemplary roughness ranges across the as-deposited film may be less than or about 10 nm, and may be less than or about 9 nm, less than or about 8 nm, less than or about 7 nm, less than or about 6 nm, less than or about 5 nm, less than or about 4 nm, less than or about 3 nm, less than or about 2 nm, less than or about 1 nm, or less. Consequently, improved materials may be produced, which may afford film and mask benefits over conventional materials and processes, as well as potentially reducing fabrication operations by limiting or reducing the number of polishing operations in a sequence.

In additional embodiments, the boron-containing material may be deposited with low stress. Low stress materials are characterized by internal stress levels that are closer to neutral stress (i.e., 0 MPa). In contrast, high stress materials are characterized by internal stress levels that are significantly greater than 0 MPa (i.e., high positive (tensile) stress) or significantly less than 0 MPa (i.e., high negative (compressive) stress). High positive stress, which may be characterized as tensile stress, may be caused by the expansion of the material that creates an outward, pushing force on adjacent substrate features. High negative stress, which may be characterized as compressive stress, may be caused by the contraction of the material that creates an inward, pulling force on adjacent substrate features. In other words, higher-stress materials may be characterized by a stress level with an absolute value that is significantly greater than 0 MPa. Thus, when a material is characterized by a stress level of "greater than −1000 MPa", this refers to the absolute value of the stress level, and includes levels such as −1500 MPa, −2000 MPa, etc. Similarly, when a material is characterized by a stress level of "less than −1000 MPa", this refers stress levels that are closer to neutral stress (i.e., 0 MPa), and includes levels such as −500 MPa, −100 MPa, etc., but does not extend to positive values greater than or about 1000 MPa.

Embodiments of the as-deposited, boron-containing material may be characterized by stress levels of less than or about −500 MPa or more. Additional exemplary stress value ranges may include less than or about −400 MPa, less than or about −300 MPa, less than or about −200 MPa, less than or about −100 MPa, less than or about −50 MPa, and less than or about −10 MPa, or less. These low-stress, boron-containing materials may be deposited on multiple stacked film layers and function as high-selectivity hardmasks to pattern etch deep, high-aspect ratio channels and contacts into the film layers. The low stress in the boron-containing materials generates less stress on the underlying substrate features like film stacks that can cause them to bend, fracture and fail.

Embodiments of the present technology may also affect additional characteristics of the as-deposited boron-containing materials. For example, embodiments of the as-deposited, boron-containing material may be characterized by Young's modulus of greater than or about 150 GPa, and may be characterized by a modulus of greater than or about 160 GPa, greater than or about 170 GPa, greater than or about 180 GPa, greater than or about 190 GPa, greater than or about 200 GPa, or more.

Embodiments of method 400 may also include the optional operation of forming the boron-containing material into a hardmask layer 425. The operation may include forming a pattern in the boron-containing hardmask for a patterned etch of substrate features in the underlying substrate. For example, openings may be formed in the as-deposited boron-containing layer to expose the underlying substrate to a dry etch (e.g., a plasma etch) that forms a deep (e.g., greater than or about 1 μm), high-aspect-ratio (e.g., an AR greater than or about 50:1) channel or contact in the substrate.

The embodiments described in method 400 may form as-deposited, low-roughness, low-stress boron-containing materials. These boron-containing materials may be characterized by an as-deposited low roughness that does not require additional treatment operations to smooth a film layer of the deposited material. The boron-containing materials may also be characterized by an as-deposited low stress that does not require additional treatment operations to reduce the stress in a deposited layer. In some embodiments, the boron-containing materials may be characterized by high optical transparency and high selectivity that makes them well suited as, for example, hardmasks to pattern etch underlying substrate features. For example, these hardmasks may be used in pattern etches of high-aspect ratio (HAR) substrate features such as 3D NAND devices. Embodiments of the present technology include provide boron-containing hardmasks in an as-deposited state on a substrate.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
  delivering a deposition precursor comprising a boron-containing precursor to a processing region of a semiconductor processing chamber;
  forming a plasma of the deposition precursor within the processing region of the semiconductor processing chamber; and
  depositing a boron-containing material on a substrate disposed within the processing region of the semiconductor processing chamber, wherein the substrate is characterized by a temperature of less than or about 50° C., and wherein the semiconductor processing chamber is characterized by a pressure of less than 100 mTorr.

2. The semiconductor processing method of claim 1, wherein the method further comprises delivering an inert precursor to the processing region of the semiconductor processing chamber, wherein a flow rate ratio of the inert precursor to the deposition precursor is greater than about 10:1.

3. The semiconductor processing method of claim 2, wherein the inert precursor comprises at least one of helium or argon.

4. The semiconductor processing method of claim 1, wherein the semiconductor processing chamber is characterized by a pressure of less than or about 50 mTorr.

5. The semiconductor processing method of claim 1, wherein the deposition precursor further comprises a boron-containing precursor.

6. The semiconductor processing method of claim 1, wherein the deposition precursor further comprises at least one of a silicon-containing precursor or a nitrogen-containing precursor.

7. The semiconductor processing method of claim 1, wherein the boron-containing material comprises at least one of boron carbide, boron-nitride, boron-carbon-nitride, boron-containing silicon, boron-containing silicon oxide, boron-and-boron-containing silicon oxide, or boron-containing silicon nitride.

8. The semiconductor processing method of claim 1, wherein the plasma is a bias plasma formed at a bias power is greater than 2000 Watts.

9. A semiconductor processing method comprising:
delivering a deposition precursor comprising a boron-containing precursor to a processing region of a semiconductor processing chamber;
applying a bias power to a substrate disposed within the processing region of the semiconductor processing chamber, wherein the bias power is greater than or about 3000 Watts;
forming a plasma of the deposition precursor within the processing region of the semiconductor processing chamber; and
depositing a boron-containing material on the substrate.

10. The semiconductor processing method of claim 9, wherein the substrate is characterized by a temperature of less than or about 50° C.

11. The semiconductor processing method of claim 9, wherein the deposition precursor further comprises an inert precursor.

12. The semiconductor processing method of claim 11, wherein a flow rate ratio of the inert precursor to the boron-containing precursor is greater than or about 10:1.

13. The semiconductor processing method of claim 9, wherein the bias power is greater than or about 4000 Watts.

14. A semiconductor processing method comprising:
delivering a boron-containing precursor to a processing region of a semiconductor processing chamber;
forming a plasma of the boron-containing precursor within the processing region of the semiconductor processing chamber;
applying a bias power to a substrate disposed within the processing region of the semiconductor processing chamber, wherein the bias power is greater than 2000 Watts; and
depositing a boron-containing material on a substrate disposed within the processing region of the semiconductor processing chamber, wherein the boron-containing material is characterized by an as-deposited surface roughness of less than or about 2 nm.

15. The semiconductor processing method of claim 14, wherein the substrate is characterized by a temperature of less than or about 50° C.

16. The semiconductor processing method of claim 14, wherein the semiconductor processing method further comprises:
delivering an inert precursor to the processing region of the semiconductor processing chamber, wherein a flow rate ratio of the inert precursor to the boron-containing precursor is greater than about 10:1,
wherein the bias power is greater than or about 3000 Watts.

17. The semiconductor processing method of claim 14, wherein the boron-containing material is characterized by an as-deposited stress that is less than or about −500 MPa.

18. The semiconductor processing method of claim 14, wherein the boron-containing material further comprises carbon atoms, and wherein greater than or about 60% of the carbon atoms have $sp^a$ hybridized bonds.

19. The semiconductor processing method of claim 14, wherein the boron-containing material comprises less than or about 25 mol % hydrogen.

20. The semiconductor processing method of claim 14, wherein the boron-containing material comprises at least one of boron carbide, boron-nitride, boron-carbon-nitride, boron-containing silicon, boron-containing silicon oxide, boron-and-boron-containing silicon oxide, or boron-containing silicon nitride.

\* \* \* \* \*